United States Patent [19]

Szczepanek

[11] Patent Number: 4,959,811
[45] Date of Patent: Sep. 25, 1990

[54] CONTENT ADDRESSABLE MEMORY INCLUDING COMPARISON INHIBIT AND SHIFT REGISTER CIRCUITS

[75] Inventor: Andre Szczepanek, Bedford, England

[73] Assignee: Texas Instruments Incorporated, Dallas, Tex.

[21] Appl. No.: 926,433

[22] Filed: Nov. 3, 1986

[51] Int. Cl.⁵ .............................................. G11C 15/04
[52] U.S. Cl. ................................. 365/49; 365/189.07; 365/189.12; 365/195; 364/715.11; 364/900
[58] Field of Search .................... 365/49, 189, 78, 195, 365/239, 240, 189.07, 189.12; 364/200 MS File, 900 MS File, 715.11

[56] References Cited

U.S. PATENT DOCUMENTS

4,575,818  3/1986  Almy et al. ............................ 365/49
4,755,974  7/1988  Yamada et al. ........................ 365/49

*Primary Examiner*—Glenn A. Gossage
*Attorney, Agent, or Firm*—William E. Hiller; N. Rhys Merrett; Melvin Sharp

[57] ABSTRACT

In a content addressable memory, a plurality of equal-sized groups of data bits are accessed simultaneously from a memory and compared with a sequence of groups from an input key code, each group consisting of the same number of consecutive data bits. Each comparison of groups of data bits produces a match indication, and a comparison of groups of data bits is inhibited unless the comparison of the preceding group of memory data bits with the preceding group of key code data bits produced a positive match indication. The match indications are stored in a shift register, which is shifted one step after each comparison to permit or inhibit the next comparison. The memory may be a dynamic semiconductor RAM accessed a row at a time. The data bits from a single row access may be compared in time with the groups of a plurality of groups of data bits, say 4, constituting the entire input key code.

16 Claims, 5 Drawing Sheets

CONTENT ADDRESSABLE MEMORY INCLUDING COMPARISON INHIBIT AND SHIFT REGISTER CIRCUITS

This invention relates to a content addressable memory system particularly, but not exclusively, for use in searching large quantities of stored data for specific data strings.

Many computerized systems require efficient searching of their memory banks in order to locate specific data stored therein, while allowing other information associated with the specific data to be retrieved. The specified data string may be a file name, its location in memory announcing the beginning of a file of data. Such a search operation may be carried out using software by implementing an algorithm in which the contents of each memory cell are accessed by a processor, the processor comparing its contents against the input data string.

More sophisticated software search routines impose restrictions on the data to be searched, perhaps requiring its data stored in memory to be present in some ordered manner. For example, if the memory is used to store a list of names, they must be present in alphabetical order. In other cases, the data stored in memory may be assigned numerical weightings and then stored in numerical order. Such restrictions impose additional software overheads on the system, and the search methods for the organized data may still take an appreciable amount of time.

The search operation may be provided as a feature of the memory in which the data is stored. Such a feature may be implemented in hardware rather than software in order to utilize the higher data rates possible in hardwired circuitry. In such a system the memory cells are accessed by content rather than address, as in a software search. This, combined with the higher data rates, considerably reduces the time required to execute a search.

Up to now such content addressable memory systems have required a large amount of complex circuitry for their implementation. It is an object of the present invention to provide a content addressable memory of simple construction and operation.

SUMMARY OF THE INVENTION

According to one aspect of the present invention, there is provided a content addressable memory comprising memory means having a plurality of storage elements accessible in blocks, each block including the same number of elements in a plurality of equal groups in a particular order. Comparator means is provides through a plurality of comparators respectively corresponding to the groups in each block, each comparator having a first and second set of inputs, with each set equal in number to the elements in a group, and producing a match indication as to whether or not the groups of data bits applied to the two sets of inputs are the same. Means for storing an input key code consisting of a plurality of groups of data bits is provided with, each group of data bits having the same number of data bits as there are storage elements in a group. Control means provides for selectively accessing a block of storage elements in the memory means so that the data bits stored therein are simultaneously applied to the first sets of inputs of the comparators, and for applying a group of data bits from an input key code simultaneously to the second set of inputs of each comparator, characterized in that there is provided a flag register means having storage elements respectively corresponding to the comparators of the comparator means, the match indications from the comparators being stored in the storage elements of the flag register means. The control means is arranged to apply the groups of data bits from the input key code in succession in a predetermined order to the second set of inputs of each comparator. Each comparator includes means for disabling itself following a comparison of an immediately preceding group of data bits from the input key code, where that comparison produced from the next adjacent comparator earlier in the particular order indicates that the groups did not match. Output means are provided responsive to a positive match indication from the comparators following a comparison with the final group of data bits from the input key code to identify the location in the accessed block of groups of data bits matching the input key code.

The output means may produce an encoded output representing the location of the matching groups of data bits, and may be arranged to produce the outputs sequentially when several matching groups of data bits exist.

The flag register means may be a shift register for shifting the stored match indications along in the particular order of the groups, thereby permitting the next comparator to execute a comparison when the match indication is positive and to inhibit that comparison when the match indication is otherwise. The flag register means and/or the control means may be arranged to convey the match indications obtained from the last groups in the next block the comparisons for the first groups in the next block, when a match to the input key code may be located bridging from one block to the next. This assumes that the control means accesses the block sequentially.

A plurality of memories according to the invention may be combined under the control of a single control means so that memories of different sizes can be produced on a modular basis.

In one example of the invention, the memory means is a 256k bit dynamic RAM having 512 rows each containing 512 storage elements divided into 64 groups of 8 elements (bytes). When a row of the RAM is accessed the 512 data bits stored in the row are output simultaneously. The comparator means therefore has 64 byte-wide comparators and produces 64 bits representing the match indications. The input key code consists of 4 bytes, which is compared a byte at a time with all the 64 bytes from the accessed row. The flag register has 64 elements respectively for the 64 match indications and is constructed as a shift register so that a positive, match indication from one comparator is shifted to the next following comparator in the particular order where it can be used to enable that comparator to execute a comparison of the next byte of the input key code with the next byte from the accessed row. Therefore, the only comparators executing a comparison of the fourth, original, byte of the input key code, with bytes in the accessed row, are those where the three preceding bytes in the row match the first three bytes of the input key code, and a positive match indication from a comparison of the fourth byte of the input key code identifies the location of a complete match of all four bytes of the input key code in the accessed row. Encoding means responds to a positive match indication from a comparison of the fourth byte of the input key code to produce a code (6 bits would be sufficient for the 64 bytes) identifying the initial byte of the four matching the input key code, and from which the full address in the RAM of the required data can be derived. A sequential selector is provided to cause the output codes to appear, one after the other, on the same conductor(s) when several positive match indications occur. The control means for the memory causes the rows of the RAM to be accessed sequentially, and the row addresses are combined with the codes from the encoding means to produce the full addresses.

Since the access time of the RAM is, in most instances, several times longer than the time needed for a comparison by the comparator, it is possible for several comparisons to be performed following each reading of data from the RAM. The use of the flag shift register as proposed above enables a multiple byte (typically 4) series of comparisons to be executed without having to delay successive accesses of the RAM.

Mask data may be applied to the comparators with the bytes of the input key code to indicate which bits of the bytes are inconsequential in locating the match to the input key code. Typically the mask data may cause certain stages of the comparators to produce positive match indications regardless of the input data to those stages.

The memory may be adjustable to use input key codes of more or less than 4 bytes.

According to a second aspect of the invention there is provided a method of finding the location an input key code having a plurality of equalsized multi-bit groups of data in a memory in which a plurality of groups of data of the same size as those of the key code are accessed simultaneously from the memory and compared simultaneously with a selected group of data of the key code. The groups of data of the key code are selected sequentially, and the results of the comparisons being noted to provide an indication of the required location, wherein comparison of a group of data of the key code with a particular group of data accessed from the memory is permitted only if the preceding group of data of the key code matched the group of data from the memory next preceding the particular group of data in the memory. The detection of a match with the final group of data of the key code indicates the location of a match with the whole of the key code.

According to a third aspect of the invention, there is provided a method of finding the location of an input key code having a plurality of equal-sized multibit groups of data in a memory including accessing simultaneously from the memory a block containing a plurality of multi-bit groups of the same size as those of the key code. Simultaneously, this method compares a first group of the key code with all groups of the accessed block, noting which groups of the accessed block match the first group of the key code, simultaneously comparing a second group of the key code with only those groups of the accessed block which are next in order to those groups which were noted as matching the first group of the key code, noting which pairs of groups of the accessed block match the first and second groups of the key code, repeating the comparing and noting steps until all groups of the key code have been compared with groups of the accessed block or until no further comparisons are permitted because no matching groups were found, and repeating the comparing and noting steps for other blocks accessed from the memory until all the memory has been accessed.

DESCRIPTION OF THE DRAWINGS

In order that the invention may be fully understood and readily carried into effect, an embodiment of it will now be described with reference to the accompanying drawings of which.

BRIEF DESCRIPTION OF THE PREFERRED EMBODIMENT

Figure 1:
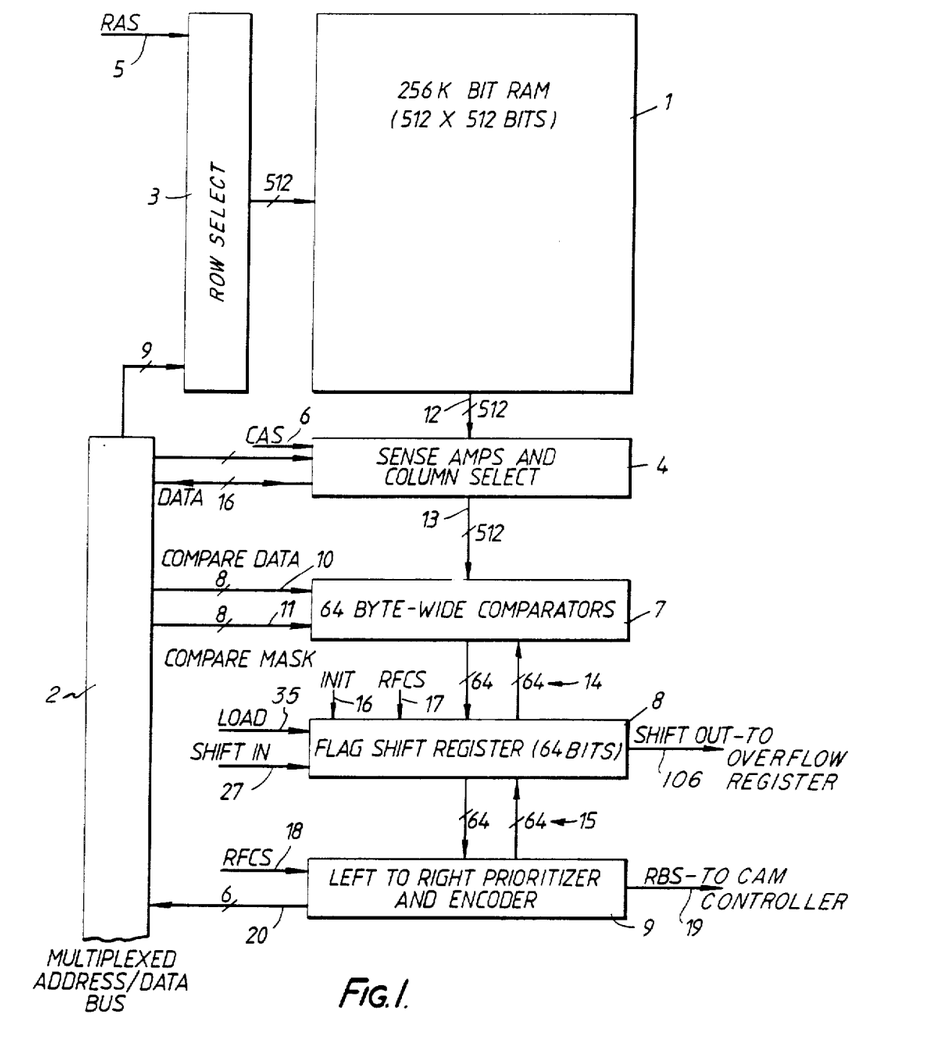
FIG. 1 is a block diagram of a 256K bit content addressable memory.

The content addressable memory system shown in FIG. 1 uses a 256K Dynamic Random Access Memory (D-RAM) 1. In the system shown, the D-RAM 1 may be also used as a conventionally addressed random access memory. The memory cells in the D-RAM 1 are arranged as an array of $512 \times 512$ cells. Each memory cell in the array may be accessed for reading and writing purposes, from a sixteen bit multiplexed data/address bus 2, in the normal manner latching the two nine bit row and column addresses from the bus 2 into row select 3 and column select 4 circuits by strobing a row address strobe (RAS) input 5 and a column address strobe (CAS) input 6, respectively. Both the RAS and CAS signals are conventional.

The data bandwidth inside a D-RAM is much higher than that observed at its input and output pins. This high data bandwith is used advantageously in the CAM system shown in FIG. 1; using only the row address circuitry 3 and supplying a suitable RAS signal to the input port 5, all of the $512 \times 512$ bits in the D-RAM are accessed in 512 memory cycles as 512 rows of data, each of 512 bits.

When the system shown in FIG. 1 is being used as a content addressable memory implementing a search of the data stored in the D-RAM, it operates under the control of an external CAM controller (not shown). The CAM controller provides the required address and control signals for the D-RAM 1, as well as the data and control signals for a comparator block 7, a flag shift register 8, and a left to right priority circuit and encoder circuit 9, which together with the D-RAM 1 form the content addressable memory.

The memory cells forming a row of memory in the D-RAM 1 are, for searching purposes, treated as contiguous, multiple bit groups of data. The length of a group of data being considerably less than that of a row. In the example to be described, these groups of data are 8-bits, or 1 byte long, a row comprising 64 contiguous groups. Alternatively a group may be larger or smaller than 1 byte. A data string stored in the D-RAM may fill one or more bytes, and the individual data strings stored are not required to all be of the same length. The individual data strings stored in the D-RAM are typically stored in order of byte significance from left to right, although there may be no difference in significance associated with the order of the groups.

The column select and sense amplifier block 4 contains a sense amplifier for each of the 512 column lines 12. The function of each of these amplifiers is to respond to the charge stored in the memory cell in the addressed row and connected to the particular column line, and to output a logic level depending upon the state of that charge. These logic signals are then passed along 512 conductors 13 to the comparator block 7.

The comparator block 7 contains 64 comparators, each for comparing two bytes of data, the comparators being respectively assigned to the bytes of data in the row. The 512 conductors carrying the logic signals representing the data stored in the accessed row are divided into 64 groups each of 8 lines, each group being applied to the inputs of a comparator. The byte of data with which comparison is to be made, that is the first byte of the key, is applied as the other input to each comparator in the block 7 simultaneously via the conductors 10. A masking input conductor 11 is also provided to the comparator block 7; the operation of which will be described with relation to the construction of the comparator hereinbelow. The outputs from each of the comparators, indicating whether or not the two bytes of data applied to it are the same, are passed along 64 conductors 14 to the 64 bit flag shift register 8. The bits in the flag shift register 8 are set or reset depending on the results of the comparisons passed to it from the comparator block 7. Each of the individual bits in the register 8 is uniquely associated with one of the comparators, in the block 7, and hence, also with the groups of data in the accessed row. The setting of a flag bit in the flag shift register 8 indicates that a match has been found. The flag bits are passed to a left to right prioritizer and encoder circuit 9 via lines 15, and can be used to identify uniquely the address of each matching byte. Each of the flag bits in the shift register 8 is passed back to the comparator adjacent to and on the right of that which set or reset it. The flag bit is applied to a disabling part of the adjacent comparator, so that if the flag was set, it enables the comparator to take part in the next comparison step, and if not, it disables the comparator for the next comparison step. It may be noted that since the access time of the RAM is likely to be several times the time needed for a comparison by the comparators, then several comparisons can be performed between successive memory accesses. The flag shift register 8 makes use of this feature because it enables a multi-byte comparison to be performed a byte at a time sequentially so that a key of, say, 4 bytes long may be searched for without delaying a sequence of memory accesses. The effect of this will be described in the following example in which a four byte key is to be searched for.

At the beginning of a search routine the data string, which is to be searched for, hereinafter referred to as the key, is entered into the system. The CAM controller stores the key in a number of byte length registers. In the example to be described, the key is four bytes long and is loaded into four registers Rφ, R1, R2, and R3; Rφ containing the left-most, or in numerical terms the most significant byte of the key.

The CAM controller sets all of the flag bits in the flag shift register 8. This is done by strobing the INIT input 16. The CAM controller then addresses the first row of the D-RAM 1. The 512 bits addressed are passed by the 512 individual conductors 12 to the sense amplifiers in block 4. The resulting set of logic signals are then passed by the 512 conductors 13 to the comparator block 7, where they are presented to the comparators in groups of 8 as previously described.

The CAM controller next outputs onto the multiplexed bus 2, the contents of the register Rφ. This is simultaneously passed, to inputs of each of the 64 comparators in the comparator block 7, via the input conductors 10.

At this time, the controller may also pass on an 8-bit mask word to the comparator block 7, this being passed to each of the comparators in the block, via the input conductors 11. For the example being described, it is assumed that no masking is required. The purpose of masking and how it is carried out will be described hereinbelow.

The comparison of the contents of register RΦ with each byte of data from the addressed row is affected by the comparator block 7, as soon as both inputs are presented.

The results of the comparisons from the comparator block 7 are loaded into the flag shift register 8 upon the strobing of the LOAD input port 35 by the controller. The comparison results are also passed to the prioritizer and encoder circuit 9 via the lines 15. Should one or more matches for this part of the key be found setting one or more flags in the flag shift register 8, this is indicated to the controller by the RBS port 19 being high.

The CAM controller then initiates the next step of the comparison procedure by presenting the contents of the next least significant group of the key, located in register R1, to the comparator block 7 via bus 2. At this stage, each of the flag bits from the Register 8 is passed through the prioritizer and encoder circuit 9, by the outgoing group of 64 conductors 14, to the disable port of the comparator just to the right of that which produced the particular flag bit. Only the comparators adjacent and to the right of those which signalled a matching group in the previous comparison are enabled. This prevents the signalling of matches corresponding to only the least significant bytes of the key. The controller then issues a LOAD signal and the above procedure is repeated for the remaining registers R2 and R3.

If at the end of any comparison step the RBS port 19 is found to be low, indicating that no match was found for the register present, the CAM controller terminates the search in that row.

If after the comparison step, the RBS port 19 is high, indicating that one or more flags are set, this condition is sensed by the CAM controller and sends an indication that at least one complete match to the key has been found in the row.

The position, or address, of the matching data strings in the DRAM 1 are found by the CAM controller strobing the Read Flag Code Strobe (RFCS) input 18 of the left to right prioritizer and encoder circuit 9, and the RFCS input 17 of the flag shift register 8. This signal, generated by the CAM controller, allows the encoder and prioritizer circuit 9 to read the left-most set flag bit in the flag shift register 8, and then gate the encoded value of its position onto the address/data bus 2 via the 6 lines 20. The flag bit is automatically reset during the process by the RFCS signal applied to the flag shift register block 8.

If the RBS port 19 remains high at the end of this process, this indicates that more than one complete match to the key has been located. The controller provides further RFCS signals to read these.

In order to detect data strings which pass over row boundaries a 4-bit overflow shift register (not shown) may be provided. The input port of this register is connected to the shift out port 106 of the flag shift register 8, its output port is connected to the shift-in port 27 of the flag shift register 8.

During the comparison procedure, after the first, second, and third comparison steps, the value of the right most flag in the flag shift register 8 is shifted into the input bit of the overflow shift register, with the other bits stored in the register shifting in the normal manner. When the next row is addressed, the bits stored in the shift register are shifted, one bit per comparison step, via the shift-in port 27 to the disable port of the left-most comparator in the comparator block 7, after the first, second, and third comparison steps. Depending on the state of the bit shifted out of the 4-bit shift register, the left-most comparator is enabled, or disabled, from taking part in the second, third, or fourth comparison steps. In this way, data strings passing over row boundaries can be detected.

Figure 2:
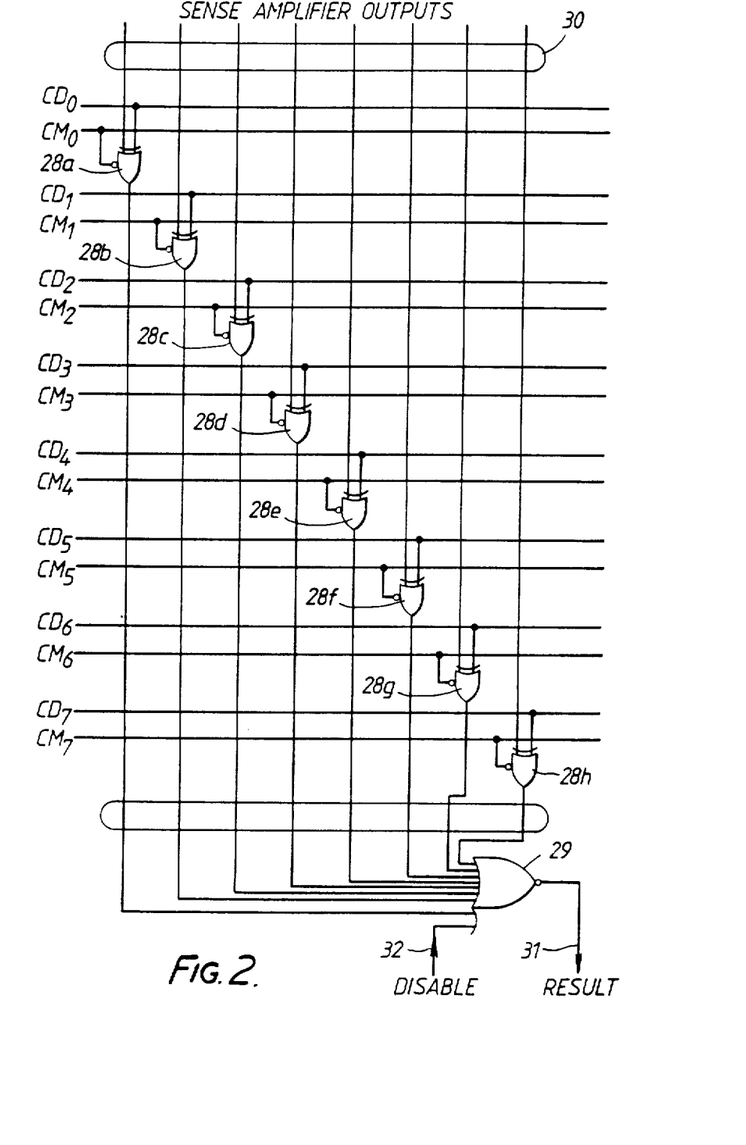
FIG. 2 is a circuit diagram of an 8-bit comparator suitable for use in the memory of FIG. 1.

FIG. 2 shows the circuit diagram of one of the byte length, or 8-bit, comparators which form the comparator block 7. The comparator has three 8-bit ports; a row data input port 30, a register data input port $CD_\phi$–$CD_7$, and a mask data input port $CM_{100}$–$CM_7$. The lines supplying the register data input port and mask data input port supply all of the comparators in the comparator block with the same data. Each row data input port 30 of the comparators in the block receives its data from a different byte in the selected row. The comparator also has a 1-bit disable port 32 on which a high level input forces the comparator result port 31 to be low, this indicating a negative result and disabling the comparator from taking part in a comparison step.

The comparator comprises eight, 2-input, Exclusive-OR (Ex-OR) gates 28$a$–$h$, the inputs of which are connected, in a bit ordered manner, to the bit inputs from the row data input port 30 and register data input port $CD_\phi$–$CD_7$. The Ex-OR gates 28$a$–$h$ have a third 1-bit inhibit port, this is connected to the respective mask data input port bit lines $CM\phi$–$CM_7$. The output ports of the Ex-OR gates 28$a$–$h$ are connected to eight input ports of a 9-input NOR gate 29, the ninth input port of which is connected to the disable input port of the comparator.

The operation of the comparator will now be described assuming that all the mask data input lines are being high so that none of the Ex-OR gates 28$a$–$h$ are inhibited. If this is the case, the output will only be low if the bits presented at its 2-input ports, are the same. This is the case when a matched condition is sensed, that is when row data and register data input bytes are identical, and the eight outputs from the Ex-OR gates to the NOR gate 29 are all low. If the disable input port 32 is also low, i.e. the comparator is enabled, the output 31 of the NOR gate 29 would be high, indicating that a row byte matching that held in the register has been found.

If one or more of the output ports of the Ex-OR gates 28$a$–$h$ is high, indicating different data bits at its two input ports, the output 31 of the NOR gate 29 would be low indicating a no-match condition. Similarly, if the disable input port 30 is high, the output port 31 of the NOR gate 29 would be held low, indicating a no-match condition and preventing the comparator from responding to a match while this signal is present.

Figure 4A:
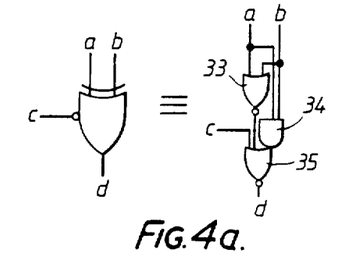
FIGS. 4a, 4b and 4c explain the non-standard circuit symbols used in FIGS. 2 and 3.

FIG. 4$a$ shows one possible circuit configuration for the Ex-OR gate having a third inhibit port. The gate comprises a two input NOR gate 33, a two input AND gate 34, and a three input NOR gate 35. The two input ports of the Ex-OR gate are denoted by the letters a and b, and each is connected to one of the input ports of the NOR gate 33 and of the AND gate 34. The outputs of the NOR gate 33 and the AND gate 34 are connected to two of the input ports of the NOR gate 35, the third port of the NOR gate 35 being connected to the inhibit port c of the Ex-OR gate.

Should the inhibit port c be low, the output port of Ex-OR gate will also be low, regardless of the other input conditions, indicating a match. This is used for the masking of the particular data bit applied to the comparator at the time.

The operation of the mask data input $CM_\phi$–$CM_7$ of the comparator will now be described. In some cases in carrying out a search through the memory looking for a particular file header, it may not be required to find an exact match to the whole of a key stored in the registers, but only to particular bits of the key. For instance a file header may contain a title, date of creation, and an author's name, any one of these may be the subject of a search, the other two being of no particular importance at the time.

In order to carry out such a search, the CAM controller outputs, simultaneously, to all the comparators a mask byte allocated to each register byte when it is presented for comparison. Depending upon whether the bits in the masking byte are high or low, they enable the individual Ex-OR gates in the comparator to output comparison bits indicating the similarity of the bits applied to them or force them to output an indication of identity of the bits. An Ex-OR gate can then indicate matching input data bits regardless of the true state of the two input data bits when selected by a masking bit, so that a match of selected bits only can be detected.

Figure 3:
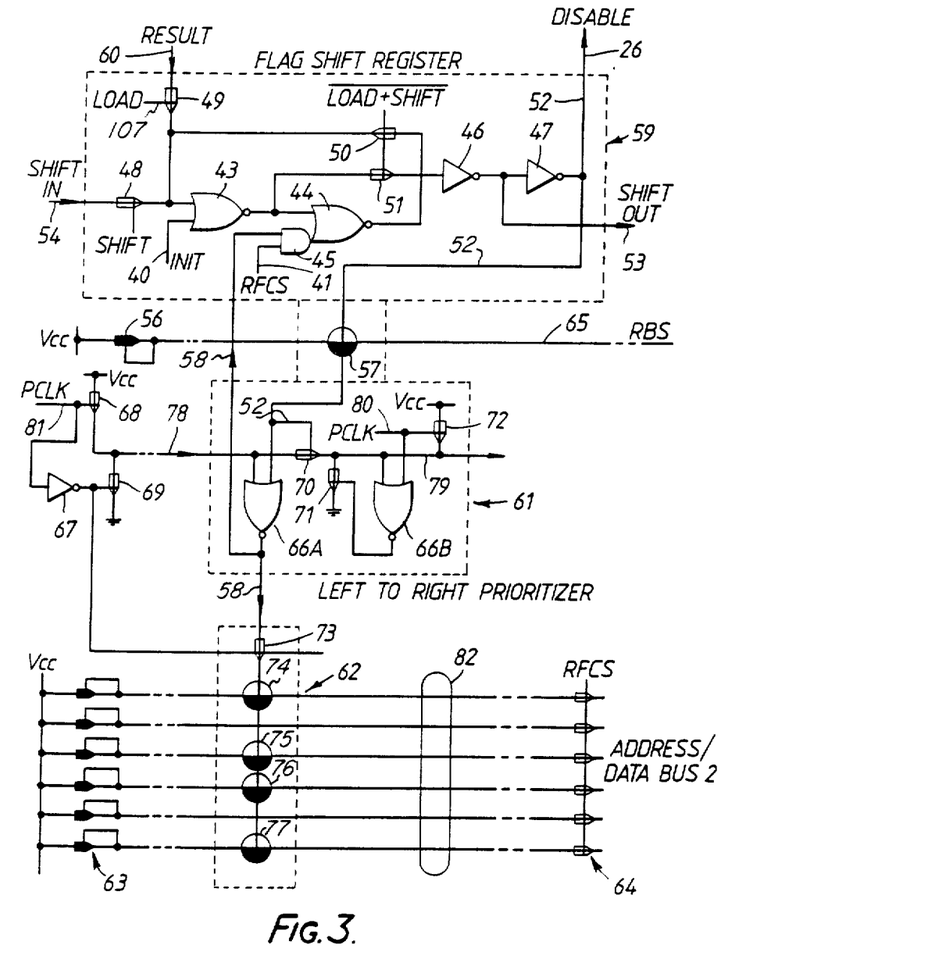
FIG. 3 shows the circuit of one stage of the flag shift register, encoder and priority circuit of FIG. 1.
Figure 4B:
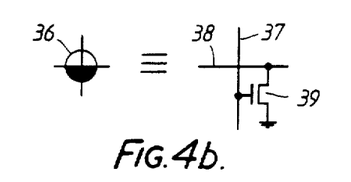
Figure 4C:
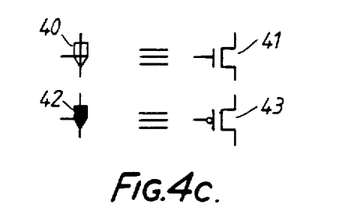

FIG. 3 shows one bit unit of the Flag Shift Register 8 and the Left to Right Prioritizer and Encoder Circuits 9, and their interconnections. FIGS. 4$b$ and 4$c$ are keys to the non-standard circuit symbols used in FIG. 3.

FIG. 4$b$ shows the circuit representation of the round half blacked symbol 36, hereinafter called a cell. This comprises an n-channel FET 39 connected between two conductors 37 and 38, its source being connected to the conductor 38, its gate to conductor 37, and its drain connected to ground. A high level on conductor 37 will cause the FET 39 to conduct so grounding the conductor 38.

FIG. 4$c$ shows the symbols 40 and 42 used for transistors. The symbol 40 represents an n-channel FET, and the symbol 42 represents a p-channel FET.

The one bit unit of the flag shift register 8 shown in FIG. 3 and denoted by the numeral 59 comprises two, 2-input, NOR gates 43 and 44, two inverters 46 and 47, a two input AND gate 45, and four n-channel FET's 48–51.

The INIT input of the Shift Register unit 59 is connected to an input port of the NOR gate 43, the other port of which is connected through the transistor 49 to the Result port 60, and through the transistor 48 to the shift in port 54 of the unit 59. The output of NOR gate 44, is also connected to the other port of the gate 43 through transistor 50. The transistors 49, 48, and 50 are respectively rendered conductive by LOAD, SHIFT and $\overline{LOAD+SHIFT}$ signals. The output port of NOR gate 43 is connected to an input port of NOR gate 44 and also through the transistor 51 controlled by the $\overline{\text{LOAD}+\text{SHIFT}}$ signal and the inverter 46 to a SHIFT OUT port 53. The output of the inverter 46 is also applied to the input of the inverter 47. The second input port of the NOR gate 44 is connected to the output port of AND gate 45. The input ports of the AND gate 45 are connected to the RFCS input port 41 of the shift register unit 59, and a conductor 58 connected from the left to right prioritizer unit 61, the operation of which will be described hereinbelow. The output port of NOR gate 44 is connected to an input port of NOR gate 43 via the transistor 50 as previously described. The output port of the inverter 47 is connected to a conductor 52 which supplies the disable output port 26 of shift register unit 59 and is connected to a cell 57 and to the left to right prioritizer unit 61.

The operation of the shift register unit will now be described. At the beginning of a search sequence on a row of the memory, the INIT input port 40 of the shift register unit 59 is strobed high by the CAM controller producing a low signal at the output port of the NOR gate 43. The transistors 50 and 51 conduct due to the presence of the $\overline{\text{LOAD}+\text{SHIFT}}$ signal. The output of NOR gate 43 is therefore connected to the input of the inverter 46, and the shift-out output port 53 of the shift register unit is set high. The inverter 47 causes the disable output port 93 to be set low. The output of the NOR gate 44 is-set high and this signal is passed back to the other input port of the NOR gate 43 via the transistor 50.

When the INIT port 40 goes low the levels at the output ports of the NOR gates 43 and 44 are held at the values set by the INIT pulse due to the $\overline{\text{LOAD}+\text{SHIFT}}$ condition still being true, the transistor 50 passing the high level output from the NOR gate 44 to an input port of the NOR gate 43. In this manner the flag set condition is latched into the unit.

The CAM controller then addresses the first row of memory in the DRAM 1 and presents the contents of -the first register holding port of the key, and a masking group of data if required, to all the comparators in the comparator block 7. The CAM controller then strobes the port 107 of the flag shift register 59, this puts the transistor 49 into a conducting state to pass the result of the comparison made by the comparator associated with the shift register unit 59 to an input port of the NOR gate 43. If a matching group to that held in the register has been found, the input to the NOR gate 43 will be high, this setting its output port low and consequently the output port of NOR gate 44 high(its other input port being low). While the load port 107 remains high, the transistors 50 and 51 do not conduct.

When the load port goes low, the transistors 50 and 51 resume their conducting states and the outputs of the NOR gates 43 and 44 are latched at their set values. The shift out port 53 will assume a high state and the disable port 26 will assume a low state. In this case, the application of the load port 107 to the transistor 49 stores the set 'flag' in the unit 59.

If the result from the comparator is negative, the application of the load port to the transistor 49 passes a low signal to the input port of the NOR gate 43 where there had previously been a high signal due to the transistor 50. The two low signals on the input ports of the NOR gate 43 make its output high. This high signal produces a low level at the output of the NOR gate 44. When the load port goes low, the transistors 50 and 51 resume their conducting states and the outputs of NOR gates 43 and 44 are latched at these values. The output of the inverter 46 is now set low making the shift out port 53 low and causing the output of the inverter 47 to be high so that the disable output port 26 of the unit is high. The reset flag result of the comparison is thus stored in the unit.

The disable output port 26 is connected to the disable input port 32 (FIG. 2) of the next comparator. On the right of the disable output port 32, the result is fed to the shift register unit.

The state of the flag stored in the shift register unit is detected by the CAM controller, which senses the RBS line 65. The conductor 52, which is connected to the disable output port 26, controls the RBS line 65 through the cell 57. If the disable port 26 is low, i.e. a match has been found, the transistor in the cell 57 is not conducting and the RBS line remains high due to current through a transistor 56. This high level on the RBS line 65 indicates to the CAM controller that a match has been found. If no match had been found, the resulting high level on the conductor 52 would cause the transistor in the cell 57 to conduct and pull the RBS line 65 to ground potential.

If at the end of a comparison procedure for a row of data in the D-RAM 1 the RBS line 65 is sensed to be high by the CAM controller. This indicates that one or more complete matches to the key data stored in the registers have been found in the row. The addresses of the matching data strings in the row are provided by the left to right prioritizer unit 61 and encoder unit 62.

The Left to Right Prioritizer Circuit 9 causes the address of the left-most set bit in the Flag Shift Register 8 to be set up on the bus 2. The prioritizer unit 61 shown in FIG. 3 comprises two, two input NOR gates 66A and 66B, and three transistors 70–72. Also associated with the left to right prioritizer unit are the two transistors 68 and 69, and an inverter 67.

One input port of the NOR gate 66A is connected to the conductor 52, connected to the disable port 26 of the shift register unit 59. The other input port of the NOR gate 66A is connected to a conductor 78, which is connected to a supply potential $V_{cc}$ through the transistor 68 controlled by the PCLK port 81. The output port of the NOR gate 66A is connected through the transistor 73 to four cells 74–77 which form an encoder unit 62. The output of the NOR gate 66A is also connected to one of the inputs of the AND gate 45 in the shift register unit 59, its other input being connected to the RFCS port 41 of the flag shift register.

The conductor 78 is joined to a conductor 79 through a transistor 70, the gate of which is connected to the conductor 52. If the conductor 52 is at a low potential the transistor 70 is non-conducting, isolating the conductor 78 from conductor 79. When a high level is present on the conductor 52, the transistor 70 is conductive, connecting the conductors 78 and 79 together.

One of the input ports of the NOR gate 66B is connected to the conductor 79, the other being connected to the PCLK port 80. The output port of the NOR gate 66B is connected to the gate of the transistor 71, the source drain path of which is connected from the conductor 79 to ground. The PCLK port 80 is also connected to control the transistor 72 and, when high, connects the supply potential $V_{cc}$ to the conductor 79 through that transistor. The PCLK port 81 is also connected to the input port of the inverter 67, from which the output controls the transistor 73 and also the transistor 69 connected from the conductor 78 to ground.

In this example, the encoder unit 62 comprises the transistor 73 and four cells 74-77, but the number of cells will vary from unit to unit depending on the code to be set up on the bus. The cells are connected to lines 82, which tend to be held positive by current through transistors 63 from the supply potential $V_{cc}$. When the transistor 73 is conducting and the output of the NOR gate 66A is high, the cells 74-77 cause the bus lines 82 to assume the code given by the positions of the cells. In the encoder unit 62 as shown, the bus lines 82 would assume the code 010010. This six bit code is the row address of the byte whose set flag condition is stored in the shift register unit 59. This address is transmitted to the bus 2 through transistors 64 in response to an RFCS signal.

The operation of the left to right prioritizer unit will now be described assuming that a high has been set in shift register unit 59, i.e. conductor 52 is low. When the CAM controller senses a high on RBS line 65 at the end of a set of comparison procedures, it provides a PCLK pulse at PCLK ports 80 and 81. This pulse activates the transistors 68 and 72 to connect the supply potential $V_{cc}$ to the conductors 78 and 79. The output of the inverter 67 goes low when the PCLK pulse goes high and consequently the transistors 69 and 73 become non-conducting. In addition, the output of the NOR gate 66B is low and the transistor 71 is in a non-conducting state. The high potential on conductor 78 produces a low at the output port of NOR gate 66A. and 72 stop conducting and the outputs of the NOR gate 66B and the inverter 67 go high rendering the transistors 71 and 69 conducting thereby grounding lines 79 and 78. The two low inputs at NOR gate 66A, conductor 52 being at a low potential, produce a high at its output port. The transistor 73 is conducting due to the high output from the inverter 67 and passes the high output from the NOR gate 66A to the cells 74 to 77. These cells are activated and inpress the bit pattern '010010' onto the six conductors 82.

While the PCLK ports remain low, the CAM controller produces an RFCS pulse, which enables the transistors 64 to conduct, and passes the bit pattern on the conductors 82 to the address/data bus 2. The RFCS signal is also supplied to the shift register unit 59 as one of the inputs of the AND gate 45, causing the resulting flag bit in the Shift Register Stage 59. The resulting high on the conductor 52 activates the cell 57 and pulls the RBS line 65 low.

The high level on conductor 52 produces a low output from NOR gate 66A, which causes a low at the outport port of the AND gate 45. The reset values are latched in the shift register unit 59 in the manner described above. The RFCS pulse is now terminated.

If the CAM controller senses that the RBS line 65 has remained high, this indicates that one or more flag bits are set in other shift register units, and additional PCLK and RFCS pulses are provided to access these. After the stage 59 has been reset, the conductor 52 is held high so that the output of the NOR gate 66A will remain low, the cells 74-77 will not be activated and the transistor 70 will be conducting. The conductors 78 and 79 will then be connected together and pass the signals from PCLK port 81 and associated circuitry directly to the next left to right prioritizer cell to the right with a set flag.

Larger areas of memory can be searched through by linking together separate memories as described above in the manner shown in FIG. 5. The shift out port of each CAM is connected to the shift in port of the next CAM on the right. The left-most CAM 91 in the row has its shift in port connected to the shift out port of the CAM controller 95 via the conductor 96. The shift in port of the CAM controller 95 is connected to CAM 94 via conductor 98.

Figure 5:
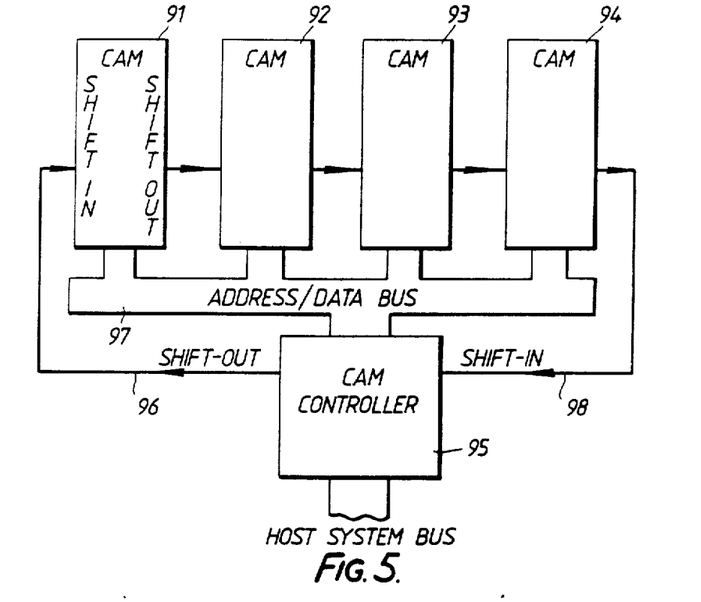
FIG. 5 shows a multiple content addressable memory.

This configuration allows 256 bytes to be searched simultaneously, where a single CAM allows only 64 bytes to be searched at a time. Assuming that each CAM contains 256K memory elements, then the capacity of the CAM of FIG. 5 is 1 Megabit. Interconnecting the CAM's directly in this way permits a smaller amount of data to be searched through, using only the uppermost rows of the 4 CAM's, so that the searching capability of the 4 sets of comparators can be used at once. This has the effect of speeding up a search by roughly the same factor as there are CAM's. Of course, the minimum time for a search would be the time needed to search one row.

Figure 6:
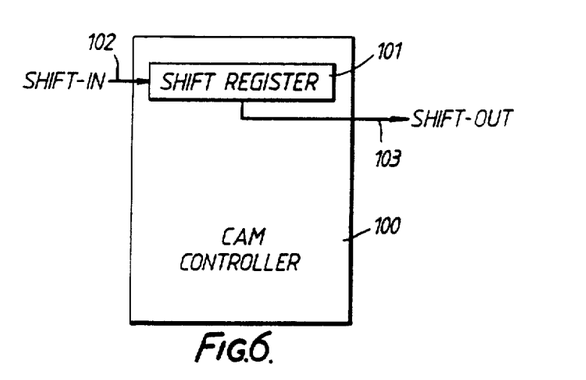
FIG. 6 shows a controller for a content addressable memory using a tappable shift register for storing intermediate data.

Variable length data strings which may pass over row boundaries can be searched for by providing a tappable shift register 101 for storing intermediate results between rows as shown in the CAM controller 100 in FIG. 6. The length of the shift register may be set by the host system or automatically by the CAM controller as a function of the number of register stages required to hold the key data string to be searched for.

What is claimed is:

1. A content addressable memory including comparison inhibit and shift register circuits comprising: memory means having a plurality of storage elements accessible in blocks, each block including the same number of elements in a plurality of equal groups in a particular order; comparator means having a plurality of comparators respectively corresponding to the groups in each block, each comparator having first and second sets of inputs, each set equal in number to the elements in a group, and producing a match indication as to whether or not the groups of data bits applied to the sets of inputs are the same, means storing an input key code consisting of a plurality of groups of data bits, each group of data bits having the same number of data bits as there are storage elements in a group; control means for selectively accessing a block of storage elements in the memory means so that the data bits stored therein are simultaneously applied to the first set of inputs of respective ones of the comparators, and for applying a group of data bits from an input key code simultaneously to the second set of inputs of each comparator, characterized in that there is provided flag register means having storage elements respectively corresponding to the comparators of the comparator means, the match indications from the comparators being stored in the storage elements of the flag register means, the control means being arranged to apply the groups of data bits from the input key code in succession in a predetermined order to the second set of inputs of each comparator, each comparator including means for disabling itself following a comparison of an immediately preceding group of data bits from the input key code, where that comparison produced, from the next adjacent comparator earlier in the particular order, an indication that the groups did not match; output means responsive to a positive match indication from the comparators following a comparison with the final group of data bits from the input key code to identify the location in the accessed block of groups of data bits matching the input key code.

2. A memory as claimed in claim 1 characterized in that the comparator means includes an input for a group of mask data bits indicating which, if any, comparisons of data bits of each group are to be treated as positive match indications in assessing the level of matching of the group.

3. A memory as claimed in claim 1 characterized in that the output means includes encoding means producing an encoded output signal representing the location of each matching group of data bits found in the memory.

4. A memory according to claim 3 characterized in that the output means produces encoded output signals in succession when more than one matching group of data bits is found in the memory.

5. A memory as claimed in claim 3 characterized in that there is provided means for combining the encoded output signals with the addresses of the accessed blocks of storage elements to produce indications of full addresses of matches to the input key code.

6. A memory as claimed in claim 1 characterized in that the flag register means includes a shift register, storage elements of which are respectively connected to receive and store the match indications from the comparators of the comparator means, means for shifting the match indications stored in the shift register along one stage following the comparisons of each group of data bits of the input key code, and means for applying signals derived from the stored match indications to respective comparators of the comparator means to permit the comparators to execute a comparison when the match indication is positive and to inhibit the comparison when the match indication is otherwise.

7. A memory is claimed in claim 6 characterized in that the shift register has more stages than there are groups of data bits in a block to enable match indications obtained from the last groups of data bits from one block to control the comparisons for the first groups in the next block, the control means being arranged to access the blocks sequentially.

8. A memory as claimed in claim 7 characterized in that the memory means consists of binary data storage elements arranged in rows and columns with a plurality of conductors corresponding to the rows for enabling the elements to be addressed in rows to produce data signals indicative of the stored data on column conductors corresponding to the columns, each row of storage elements forming a block addressed by the control means, and being divided up to form the groups.

9. A memory as claimed in claim 8 characterized in that each group contains 8 elements and each block contains 64 groups.

10. A memory as claimed in claim 8 characterized in that the control means is arranged to address the rows of storage elements in succession.

11. A memory as claimed in claim 8 characterized in that the memory means is a dynamic random access semiconductor memory.

12. A memory as claimed in claim 11 characterized in that each time a row of the memory means is addressed and the data signals are produced on the column conductors, the entire input key code is applied one group after another to the comparator means.

13. A method of finding the location of an input key code having a plurality of equal-sized multi-bit groups of data in a memory, said method comprising:
simultaneously accessing from the memory of a plurality of groups of data of the same size as those of the key code and including a greater number of groups of data than the number of groups of data of the key code;
simultaneously comparing all of the groups of data as simultaneously accessed from the memory with a first group of data of the key code as selected in sequence;
observing any matches of respective groups of data as simultaneously accessed from the memory with the first group of data of the key code as compared thereto;
reducing the number of previous comparisons by comparing only those respective groups of data as accessed from the memory immediately succeeding any matching respective groups of data as compared to the first group of data of the key code with a second group of data of the key code following the first group of data of the key code in sequence in a simultaneous comparison;
observing any matches in the reduced number of comparisons as between respective groups of data accessed from the memory with the second group of data of the key code; and
determining the location of a match of the input key code in the memory when a match of a group of data accessed from the memory with the last group of data of the key code is observed.

14. A method as claimed in claim 13 wherein the memory contains storage elements arranged in rows and columns, the data stored in the storage elements being accessed a row at a time to produce a plurality of groups of data signals on column conductors.

15. A method as set forth in claim 13, further including storing indications of any matches observed of respective groups of data as simultaneously accessed from the memory when compared with a group of data of the key code in a shift register; shifting all match indications after the comparison in which such match indications were observed to present immediately succeeding respective groups of data as accessed from the memory for comparison to a subsequent group of data of the key code in a reduced number of comparisons.

16. A method of finding the location of an input key code having a plurality of equal-sized multi-bit groups of data in a memory, said method comprising:
simultaneously accessing from the memory a block of data containing a plurality of multi-bit groups of the same size as those of the key code and including a greater number of groups of data than the number of groups of data of the key code;
simultaneously comparing all of the groups of data of the block of data as simultaneously accessed from the memory with a first group of data of the key code as selected in sequence;
observing any matches of respective groups of data of the block of data as simultaneously accessed from the memory with the first group of data of the key code as compared thereto;
reducing the number of previous comparisons by simultaneously comparing only those respective groups of data of the block of data as accessed from the memory which are next in order to those groups which were observed as matching the first group of data of the key code with a second group of data of the key code following the first group of data of the key code in sequence;

observing which pairs of groups of data of the block of data as accessed from the memory match the first and second groups of data of the key code;

repeating the comparing and the observing steps where the number of previous comparisons is further reduced based upon matching groups of data until the groups of data of the block of data as accessed from the memory have been compared with all groups of data of the key code, or until no further comparisons can occur because no matching groups of data were found; and repeating the comparing and the observing steps for other blocks of data as simultaneously accessed from the memory with the respective groups of data of the input key code until all of the blocks of data in the memory have been accessed.

* * * * *